(12) United States Patent
Hirata

(10) Patent No.: US 7,772,699 B2
(45) Date of Patent: Aug. 10, 2010

(54) SEMICONDUCTOR DEVICE AND METHOD OF MANUFACTURING THE SAME

(75) Inventor: Shinya Hirata, Tokyo (JP)

(73) Assignee: NEC Corporation, Tokyo (JP)

( * ) Notice: Subject to any disclaimer, the term of this patent is extended or adjusted under 35 U.S.C. 154(b) by 107 days.

(21) Appl. No.: 12/035,964

(22) Filed: Feb. 22, 2008

(65) Prior Publication Data

US 2008/0211094 A1 Sep. 4, 2008

(30) Foreign Application Priority Data

Mar. 1, 2007 (JP) .............................. 2007/051268

(51) Int. Cl.
*H01L 23/48* (2006.01)
*H01L 21/44* (2006.01)

(52) U.S. Cl. .................. 257/741; 257/678; 257/E23.01; 257/E21.476; 438/687; 438/400; 438/424

(58) Field of Classification Search .................. 257/741, 257/723, 678, 758, 753, 781, E23.01, E21.476, 257/E23.004, E23.178, E23.02, E21.545, 257/E21.546, E23.002; 438/687, 400, 296, 438/424, 612

See application file for complete search history.

(56) References Cited

U.S. PATENT DOCUMENTS

2001/0042918 A1* 11/2001 Yanagida ..................... 257/753
2005/0116324 A1* 6/2005 Yamaguchi .................. 257/678

FOREIGN PATENT DOCUMENTS

JP 2004-71906 A 3/2004

* cited by examiner

*Primary Examiner*—Victor A Mandala
*Assistant Examiner*—Whitney Moore
(74) *Attorney, Agent, or Firm*—Sughrue Mion, PLLC

(57) ABSTRACT

A semiconductor device includes an electrode pad formed on a pad forming surface of a semiconductor integrated circuit chip, and a step formed on the pad forming surface to surround the electrode pad. A method of manufacturing the semiconductor device includes forming a metal film on a pad forming surface of a semiconductor integrated circuit chip, forming an electrode pad on a pad forming surface by selectively etching a metal film using a first mask pattern and forming a step to surround the electrode pad by selectively etching the pad forming surface using a second mask pattern.

8 Claims, 4 Drawing Sheets

SEMICONDUCTOR DEVICE AND METHOD OF MANUFACTURING THE SAME

This application is based upon and claims the benefit of priority from Japanese patent application No. 2007-051268, filed on Mar. 1, 2007, the disclosure of which is incorporated herein in its entirety by reference.

BACKGROUND OF THE INVENTION

The present invention relates to a semiconductor device having an electrode pad and a method of manufacturing the same.

Products with giga-Hz operating frequencies are popular along with micropatterning and high-speed operations of semiconductor devices. A technique for high-speed operation uses a flip-chip structure using a copper electrode pad. As shown in FIG. 7, in this flip-chip structure, a silicon oxide cover layer 1102 and a polyimide protective film 1103 are formed on an uppermost interconnection layer 1101 of a semiconductor integrated circuit chip. A through hole is formed to extend from the protective film 1103 to the interconnection layer 1101. A copper electrode pad 1104 is formed to be connected to the interconnection layer 1101 through the through hole.

In this structure, however, since the end portion of the electrode pad 1104 rides on the end portion of the opening of the protective film 1103 with poor adhesion properties. The electrode pad 1104 is readily peeled from the protective film 1103. In this structure, the electrode pad 1104 is held with a bonding force of the interconnection layer 1101. When the semiconductor integrated circuit is further micropatterned, and the interconnection layer 1101 is further thinned, the bonding area decreases. As a result, the peeling problem becomes more conspicuous.

As opposed to the above structure, a structure with an electrode pad shown in FIG. 8 is available (Japanese Patent Laid-Open No. 2004-071906). In this semiconductor device, after a copper electrode pad 1203 is formed, the upper central portion of the electrode pad 1203 is exposed. A polyimide protective film 1204 is formed to surround the electrode pad 1203. In the structure part of which is illustrated in FIG. 8, peeling of the electrode pad 1203 can be suppressed. After a silicon oxide cover layer 1202 is formed on an uppermost interconnection layer 1201 of the semiconductor integrated circuit chip, a through hole is formed in the cover layer 1202 to reach the interconnection layer 1201, and the electrode pad 1202 is connected to the interconnection layer 1201 via the through hole.

In the general manufacture of semiconductor devices, it is difficult to etch copper by dry etching using a reaction gas or the like. The copper electrode pad is formed as follows. A copper film is formed by plating or the like, a mask pattern is formed by the photolithography technique, and the copper film is selectively removed by wet etching using an etching solution (chemical solution) and the mask pattern as a mask.

When the electrode pad 1203 is formed by wet etching as described above, a copper residue by wet etching is left on the cover layer 1202 around the electrode pad 1203. The copper residue forms an electrical path (leakage path) connected to the electrode pad 1203. Leakage occurs in the electrode pad 1203. This causes the decrease in yield and adversely affects the functions of semiconductor devices to degrade reliability. For these reasons, improvements are required.

SUMMARY OF THE INVENTION

The present invention has been made to solve the conventional problems described above and has as its object to reduce leakage in an electrode pad.

According to an aspect of the present invention, there is provided a semiconductor device comprising an electrode pad formed on a pad forming surface of a semiconductor integrated circuit chip, and a step formed on the pad forming surface to surround the electrode pad.

According to another aspect of the present invention, there is provided a method of manufacturing a semiconductor device, comprising the steps of forming a metal film on a pad forming surface of a semiconductor integrated circuit chip, forming an electrode pad on the pad forming surface by selectively etching a metal film using a first mask pattern, and forming a step to surround the electrode pad by selectively etching the pad forming surface using a second mask pattern.

DESCRIPTION OF THE PREFERRED EMBODIMENTS

Figure 1:
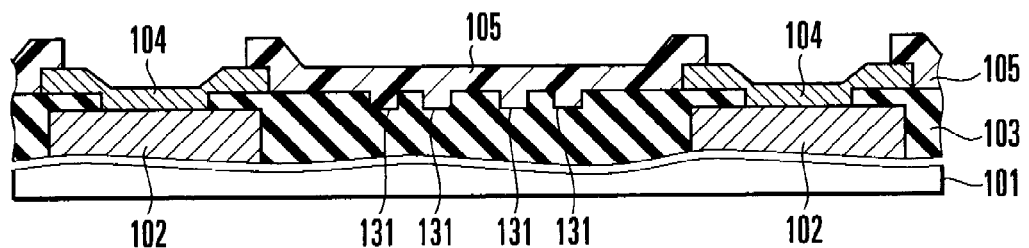
FIG. 1 is a sectional view showing part of the structure of a semiconductor device according to an embodiment of the present invention.

The embodiments of the present invention will be described in detail with the accompanying drawings.

A semiconductor device according to an embodiment of the present invention comprises a semiconductor integrated circuit chip 101 on which a plurality of elements such as MOS transistors are formed, an uppermost interconnection layer 102 of the semiconductor integrated circuit chip 101, and a cover layer 103 formed to cover the interconnection layer 102. The cover layer 103 is made of, e.g., silicon oxide and has a through hole formed in part of the upper surface of the interconnection layer 102. Note that the cover layer 103 need not be made of silicon oxide, but may be made of silicon oxinitride (SiON) or silicon oxifluoride (SiOF).

The semiconductor device according to this embodiment further comprises, on the pad forming surface of the upper surface of the cover layer 103, copper electrode pads 104 respectively connected to the interconnection layers 102 via the through holes, trenches 131 formed in the corresponding pad forming surfaces (the upper surface of the cover layer 103) around the corresponding electrode pads 104, and a protective film 105 formed on the pad forming surface so as to exposure parts of the upper surfaces of the electrode pads 104 and surround the electrode pads 104 including the trenches 131. The electrode pad 104 may have a flip chip structure.

Figure 2:
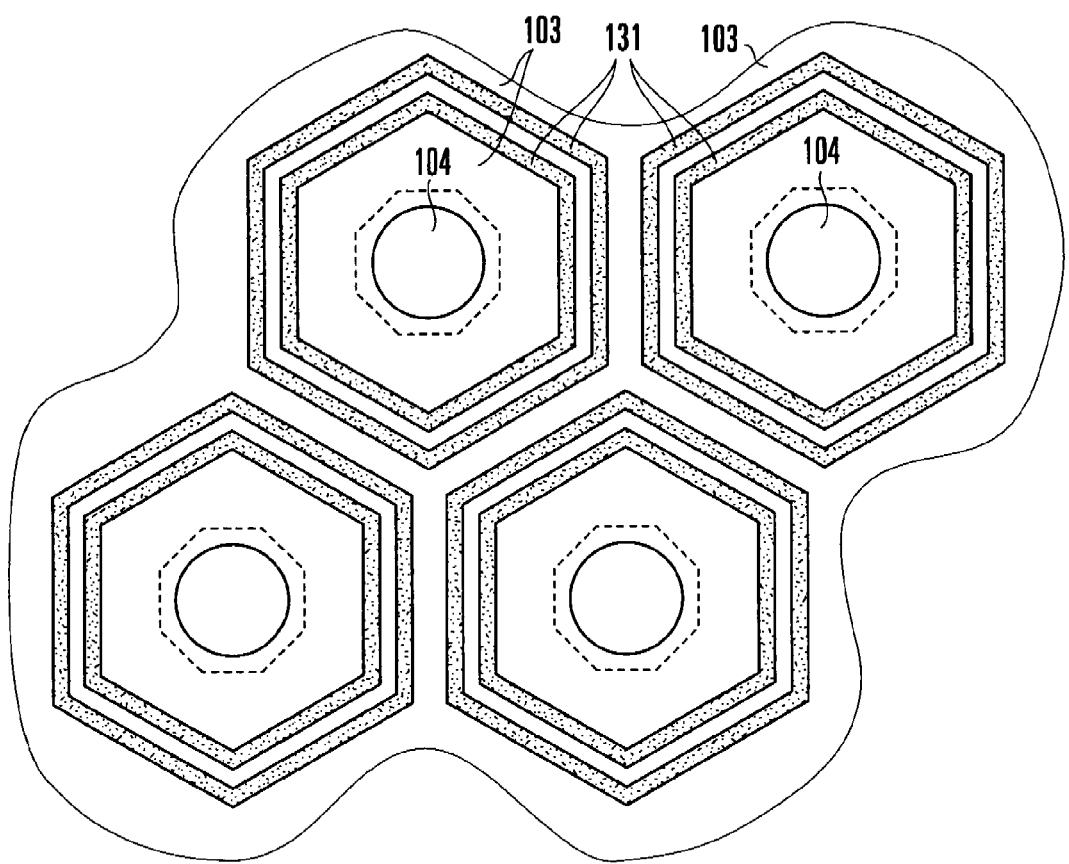
FIG. 2 is a plan view showing part of the structure of the semiconductor device shown in FIG. 1.

The two trenches 131 are formed to surround the corresponding electrode pad 104. More specifically, as shown in FIG. 2, the two hexagonal trenches 131 are formed to surround each of the plurality of electrode pads 104. Each trench 131 has the hexagonal shape in FIG. 2. However, the shape of the trench 131 need not be limited to this shape, but can be any shape if it can be formed to surround the corresponding electrode pad 104. The number of trenches 131 formed around the electrode pad 104 is not limited to two, but can be one, or three or more.

In the semiconductor device described above, even if copper is left by wet etching on the pad forming surface of the upper surface of the cover layer 103, the thin copper layer of the copper residue is divided by forming the trenches 131. This makes it possible to suppress the leakage current in the electrode pad 104. As shown in FIG. 2, when the semiconductor device has the trenches 131 having the same shape and equal in number in the plurality of electrode pads 104, uniform characteristics can be achieved on the chip as a whole. In this semiconductor device, as shown in FIG. 1, the protective film 105 is formed to cover the end portions (parts) of the electrode pads 104. Peeling of the electrode pads 104 hardly occurs.

Figure 3A:
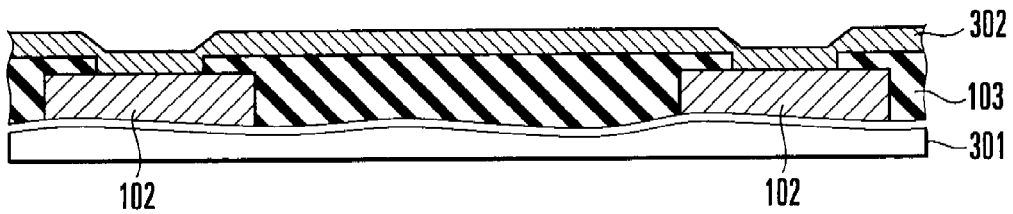
FIGS. 3A to 3E are sectional views showing the main steps in manufacturing the semiconductor device shown in FIG. 1.

A method of manufacturing the semiconductor device according to the embodiment will be described below. As shown in FIG. 3A, a semiconductor integrated circuit substrate 301 on which a plurality of elements such as MOS transistors are formed is prepared. The semiconductor integrated circuit substrate 301 has an uppermost interconnection layer 102 and a cover layer 103 formed to cover the interconnection layer 102. The cover layer 103 is made of, e.g., silicon oxide and has a through hole in part of the upper surface of the interconnection layer 102.

For example, after forming the interconnection layer 102, a silicon oxide film is formed to cover the interconnection layer 102. An opening (through hole) reaching the upper surface of the interconnection layer 102 is formed at a predetermined position of the silicon oxide film by the known photolithography and etching techniques, thereby forming the cover layer 103. After forming the cover layer 103 as described above, a copper film (metal film) 302 is formed by, e.g., plating, on the cover layer 103 including the through hole.

Figure 3B:
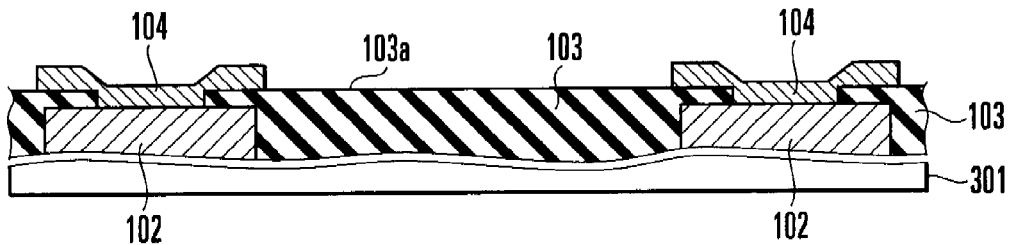

The formed copper film 302 is selectively etched by wet etching using the first mask pattern formed by the known photolithography technique. As shown in FIG. 3B, an electrode pad 104 connected to the corresponding interconnection layer 102 is formed on a pad forming surface 103a of the upper surface of the cover layer 103. For example, wet etching for the copper film 302 uses an aqueous mixed acid solution of phosphoric acid, nitric acid, and acetic acid as an etchant.

Figure 3C:
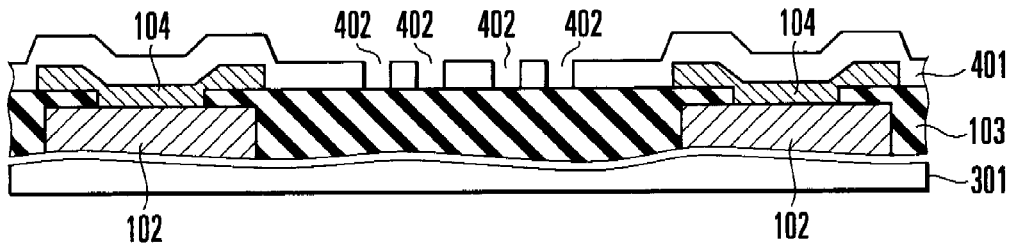

As shown in FIG. 3C, a resist pattern 401 having an opening pattern 402 formed to surround the electrode pads 103 is formed on the surface (pad forming surface) of the cover layer 103 around the electrode pads 104. For example, using a known positive photoresist, exposure and development can be performed by the photolithography technique, thereby forming the resist pattern 401.

Figure 3D:
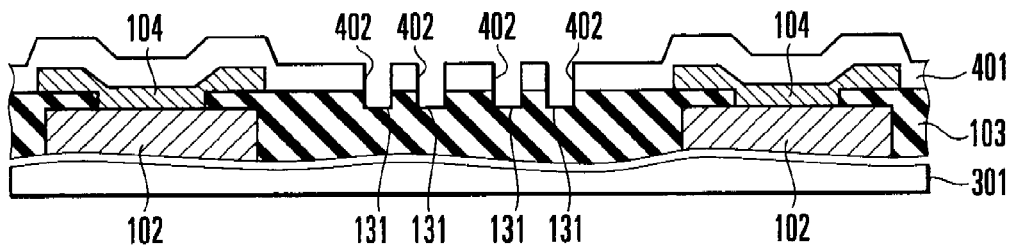

As shown in FIG. 3D, the layer under the resist pattern 401 is selectively etched by known dry etching using the resist pattern 401 as the second mask pattern, thereby forming trenches 131 having a shape to surround the electrode pads 104. The trenches 131 are formed by plasma etching (reactive ion etching) using a gas mixture of $CF_4$ gas and oxygen gas as an etching gas.

According to this dry etching, the copper etching residue on the upper surface of the cover layer 103 can be removed by the physical impact of ions generated by the plasma. The copper etching residue has a very small film thickness and can easily be removed within a practical etching time. As a result, an electrical path (leakage path) connected to each electrode pad 104 is disconnected to prevent leakage current in the electrode pad 104.

Figure 3E:
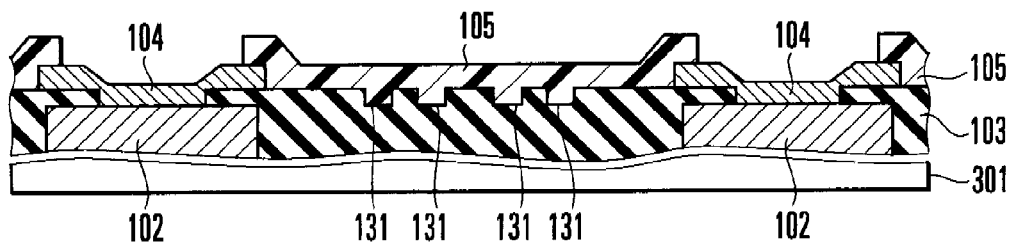

After forming the trenches 131 as described above, the resist pattern 401 is removed, and a polyimide film is applied to the cover layer 103 including the electrode pads 104 and the trenches 131. An opening is then formed in the resultant polyimide film. For example, when a photosensitive polyimide film is used, it is exposed and developed to form an opening in the upper surface of the electrode pad 104. As shown in FIG. 3E, the protective film 105 which partially exposes the upper surface of the electrode pad 104 and surrounds the electrode pad 104 including the trenches 103 is formed on the upper surface (pad forming surface) of the cover layer 103. The semiconductor integrated circuit substrate 301 is cut into chips, thereby obtaining the semiconductor integrated circuit chip 101 shown in FIG. 1.

Figure 4:
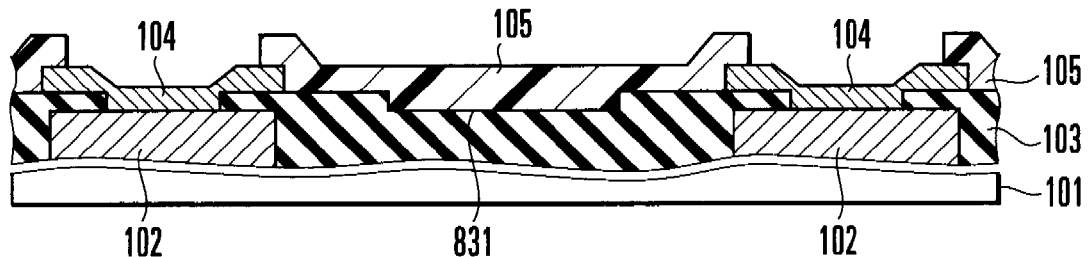
FIG. 4 is a sectional view showing part of the structure of a semiconductor device according to another embodiment of the present invention.

The plurality of trenches 131 are formed around each electrode pad 104. However, the present invention is not limited to this. For example, one trench may be formed around one electrode pad. As shown in FIG. 4, one trench 831 shared by the adjacent electrode pads 104 may be formed. However, when the plurality of trenches (steps) are formed, the surface area of the cover layer 103 in this region increases, thereby increasing the bonding strength with the protective film 105 formed on the cover layer 103.

As described above, according to this embodiment, the leakage current in the electrode pad 104 can be prevented. The bonding strength between the cover layer 103 and the protective film 105 increases. For these reasons, the product yield and then productivity increase, and the product quality can improve.

Figure 5:
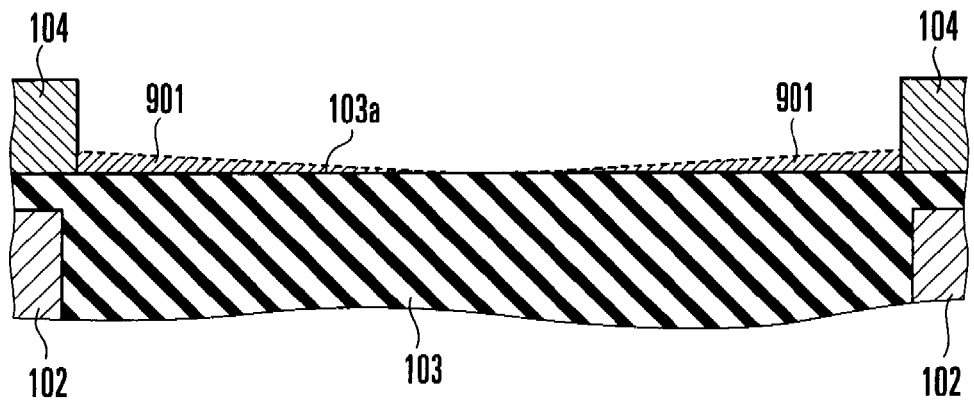
FIG. 5 is a sectional view for explaining the state of a residue left by copper etching.
Figure 6:
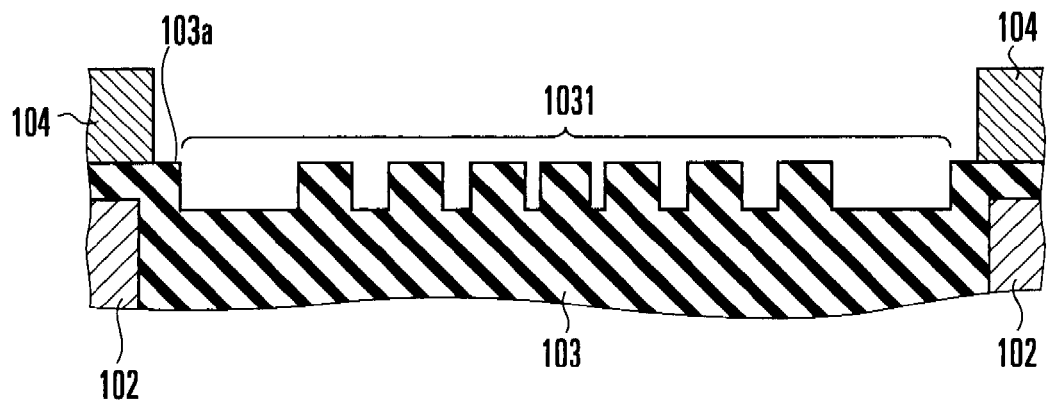
FIG. 6 is a sectional view showing part of the structure of a semiconductor device according to still another embodiment of the present invention.
Figure 7:
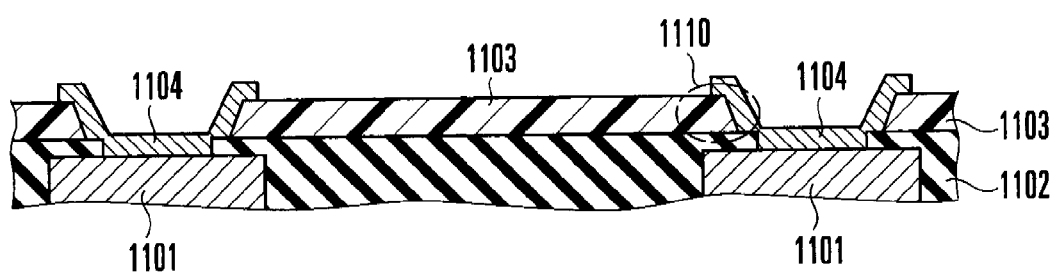
FIG. 7 is a sectional view showing an example of the structure of a conventional semiconductor device.
Figure 8:
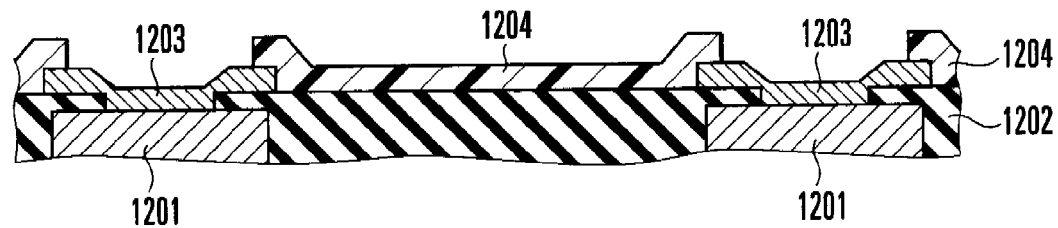
FIG. 8 is a sectional view showing an example of the structure of another conventional semiconductor device.

The residue by wet etching has a larger thickness near a wanted pattern region. For example, as shown in FIG. 5, a copper etching residue 901 is thicker in a region near the electrode pad 104 and thinner in a region away from the electrode pad 104 on the pad forming surface 103a of the cover layer 103. To the contrary, as shown in FIG. 6, when a trench 1031 wider in a region near the electrode pad 104 is formed to surround the electrode pad 104 on the pad forming surface 103a around the electrode pad 104, the residue can be more effectively removed. As described above, in trench formation using the mask pattern, etching progresses more effectively in a portion with a wider opening pattern. A wider trench is formed in a region where the residue is thick, thereby efficiently removing the residue and effectively preventing the shortcirucit.

The trenches (steps) are formed around each electrode pad to suppress the current leakage in the electrode pad. However, the leakage preventing means is not limited to this. For example, slit-like trenches (steps) may be formed in an interlayer dielectric layer between interconnection layers in the copper interconnection portion formed by the so-called damascene method and constituting the integrated circuits of the semiconductor integrated circuit chip.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. A semiconductor device comprising:
    an electrode pad formed on a pad forming surface of a semiconductor integrated circuit chip; and
    a trench formed on said pad forming surface to surround said electrode pad,
    wherein the trench comprises a plurality of trenches formed around said electrode pad and wherein said trench has a larger width near said electrode pad.

2. A method of manufacturing a semiconductor device, comprising the steps of:
    forming a metal film on a pad forming surface of a semiconductor integrated circuit chip;
    forming an electrode pad on the pad forming surface by selectively etching a metal film using a first mask pattern; and
    forming a step to surround the electrode pad by selectively etching the pad forming surface using a second mask pattern.

3. A method according to claim 2, wherein the step of forming a metal film comprises the step of forming a film made of copper as the metal film.

4. A method according to claim 2, wherein the step of forming an electrode pad comprises the step of performing wet etching.

5. A method according to claim 2, wherein the step of forming a step comprises the step of forming a trench as the step.

6. A method according to claim 5, wherein the step of forming a trench comprises the step of forming a plurality of trenches around the electrode pad.

7. A method according to claim 6, wherein the step of forming a plurality of trenches comprises the step of forming a wider trench near the electrode pad.

8. A method according to claim 2, further comprising the step of forming a protective film on the pad forming surface so as to surround the electrode pad including the step and partially expose the electrode pad.

* * * * *